(12) United States Patent
Kuo et al.

(10) Patent No.: US 9,306,496 B2
(45) Date of Patent: Apr. 5, 2016

(54) FREQUENCY MULTIPLIER APPARATUS AND OPERATING METHOD THEREOF

(71) Applicant: National Chiao Tung University, Hsinchu (TW)

(72) Inventors: Chien-Nan Kuo, Hsinchu (TW); Tzu-Chao Yan, Tainan (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 182 days.

(21) Appl. No.: 13/896,950

(22) Filed: May 17, 2013

(65) Prior Publication Data

US 2014/0084971 A1    Mar. 27, 2014

(30) Foreign Application Priority Data

Sep. 21, 2012 (TW) .............................. 101134839 A (51) Int. Cl.
*H03B 19/00* (2006.01)
*H03B 5/12* (2006.01)
*H03B 19/14* (2006.01)

(52) U.S. Cl.
CPC .............. *H03B 19/00* (2013.01); *H03B 5/1215* (2013.01); *H03B 5/1228* (2013.01); *H03B 5/1253* (2013.01); *H03B 5/1296* (2013.01); *H03B 19/14* (2013.01)

(58) Field of Classification Search
CPC ...... H03B 19/00; H03B 19/14; H03B 5/1215; H03B 5/1228; H03B 5/1253
See application file for complete search history.

(56) References Cited

U.S. PATENT DOCUMENTS

| 6,864,728 | B1 * | 3/2005 | Lu .................. | 327/122 |
| 8,432,198 | B2 * | 4/2013 | Liang et al. ........... | 327/156 |
| 8,854,091 | B2 * | 10/2014 | Hossain et al. ........ | 327/116 |
| 8,890,626 | B2 * | 11/2014 | Chen et al. ............ | 331/57 |
| 2009/0160502 | A1 * | 6/2009 | Lu et al. ............... | 327/119 |
| 2009/0175116 | A1 * | 7/2009 | Song et al. ........... | 365/233.12 |
| 2010/0073052 | A1 | 3/2010 | Choi et al. | |
| 2010/0259305 | A1 * | 10/2010 | Lee et al. ............. | 327/157 |
| 2011/0187420 | A1 * | 8/2011 | Kuo et al. ............ | 327/119 |
| 2012/0007640 | A1 * | 1/2012 | Cao ..................... | H03L 7/18 327/156 |
| 2012/0062286 | A1 * | 3/2012 | Ginsburg et al. ..... | 327/148 |
| 2012/0062287 | A1 * | 3/2012 | Jang et al. ........... | 327/156 |
| 2013/0002318 | A1 * | 1/2013 | Lu et al. .............. | 327/156 |
| 2015/0091658 | A1 * | 4/2015 | Shima et al. ......... | 331/8 |

FOREIGN PATENT DOCUMENTS

TW    200913500 A    3/2009
TW    201218634 A    5/2012

OTHER PUBLICATIONS

Office action from Taiwanese Intellectual Property Office (TIPO) in a counterpart Taiwanese patent application issued on Jun. 10, 2015. (All the cited references are listed herein.).

* cited by examiner

*Primary Examiner* — Ryan Jager
(74) *Attorney, Agent, or Firm* — The PL Law Group, PLLC (57) ABSTRACT

The present invention provides a frequency multiplier apparatus. The frequency multiplier apparatus includes an injection-locked frequency multiplier and a frequency-to-control signal converter. The injection-locked frequency multiplier outputs an output signal having a first frequency in response to an input signal having a first basic frequency. The frequency-to-control signal converter provides a first control signal to the injection-locked frequency multiplier in response to the input signal. The injection-locked frequency multiplier adjusts the first frequency to a second frequency in response to a change of the first control signal when the first basic frequency is changed to a second basic frequency.

8 Claims, 10 Drawing Sheets

FREQUENCY MULTIPLIER APPARATUS AND OPERATING METHOD THEREOF

CROSS REFERENCE TO RELATED APPLICATION AND CLAIM OF PRIORITY

The present invention claims the benefits of priority from the Taiwanese Patent Application No. 101134839, filed on Sep. 21, 2012, the contents of the specification of which are hereby incorporated herein by reference.

FIELD OF THE INVENTION

The present invention relates to a frequency multiplier apparatus and the operating methods thereof, particularly an auto-adjustable frequency multiplier apparatus and the operating methods thereof.

BACKGROUND OF THE INVENTION

Due to the restriction of the injection-locking mechanism, the lockable bandwidth of output signals of ordinary injection-locked frequency multiplier is small, and therefore the range of operable frequencies of the output signals thereof is limited. Please refer to FIG. 1, which illustrates an injection-locked frequency multiplier 10 according to the prior art. The injection-locked frequency multiplier 10 includes an oscillator 20 with transistors 201, 201, inductors 203, 204, and a current source 205. The injection-locked frequency multiplier 10 further includes transistors 101, 102, buffers 103, 104 and a current source 105. The buffers 103, 104 have input terminals in+, in− and output terminals out+, out−, respectively.

Figure 1:
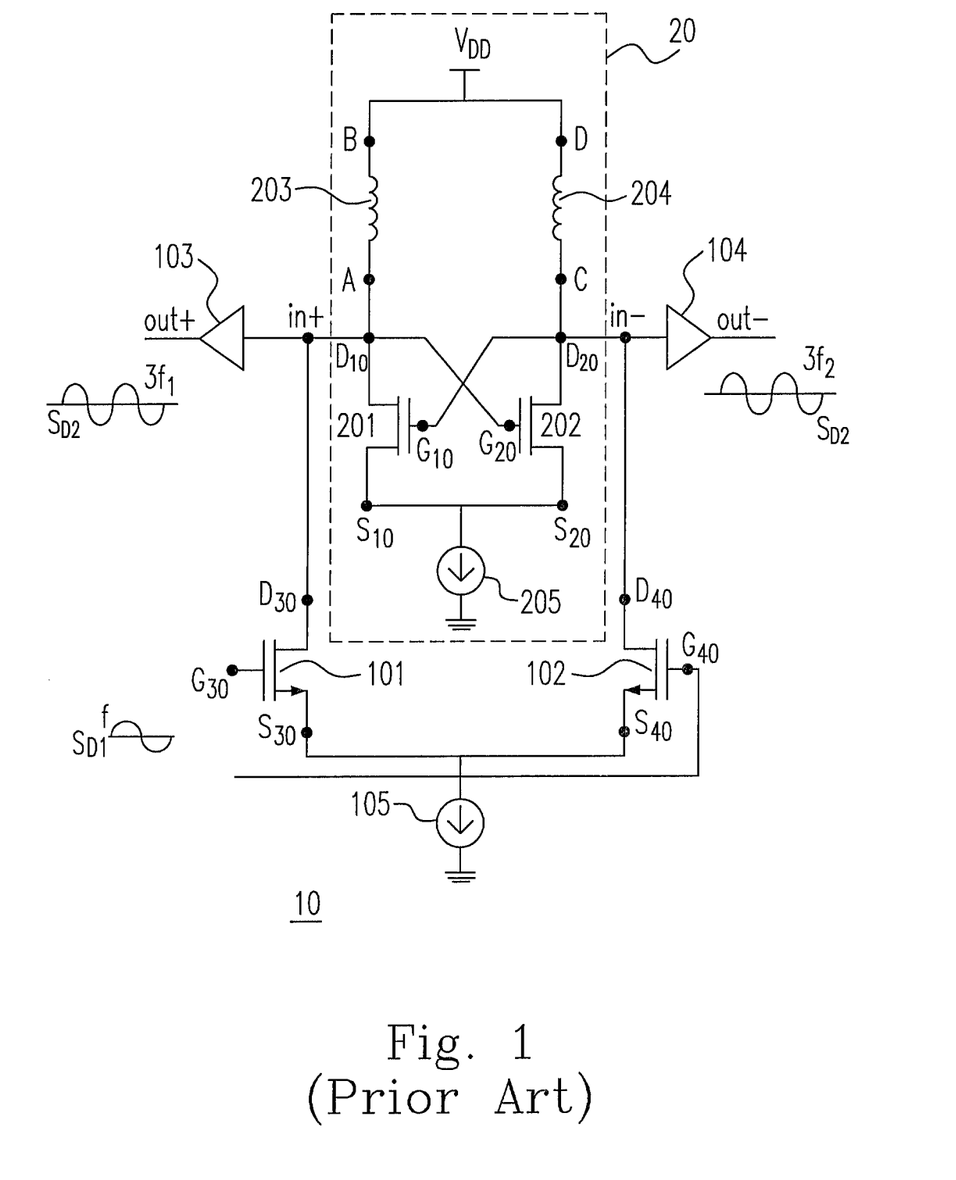
FIG. 1 is a schematic diagram showing one injection-locked frequency multiplier according to the prior art.

The oscillation frequency of the oscillator 20 is fixed, relevant to the amount of the parasitic capacitance (not shown) due to the capacitors 201, 202 and the inductors 203, 204, and to be locked at M times of basic frequency f of a differential signal $S_{D1}$ by using harmonic signals $S_{D2}$, $S_{D3}$, which are generated by inputted the differential signal $S_{D1}$ into gates $G_{30}$, $G_{40}$ of the transistors 101, 102, respectively. M is the ratio of injection-locked frequency multiplier. Accordingly, the range of the lockable frequency is relatively small. When there is a need to adjust the output frequency of the injection-locked frequency multiplier, not only the basic frequency f of the differential signal $S_{D1}$ but also the resonated frequency of oscillator 20 which is determined by capacitances of capacitors 201, 202 and the inductances of inductors 203, 204 should be changed. Therefore, another type of injection-locked frequency multiplier is provided for improving the abovementioned deficiency.

Figure 2:
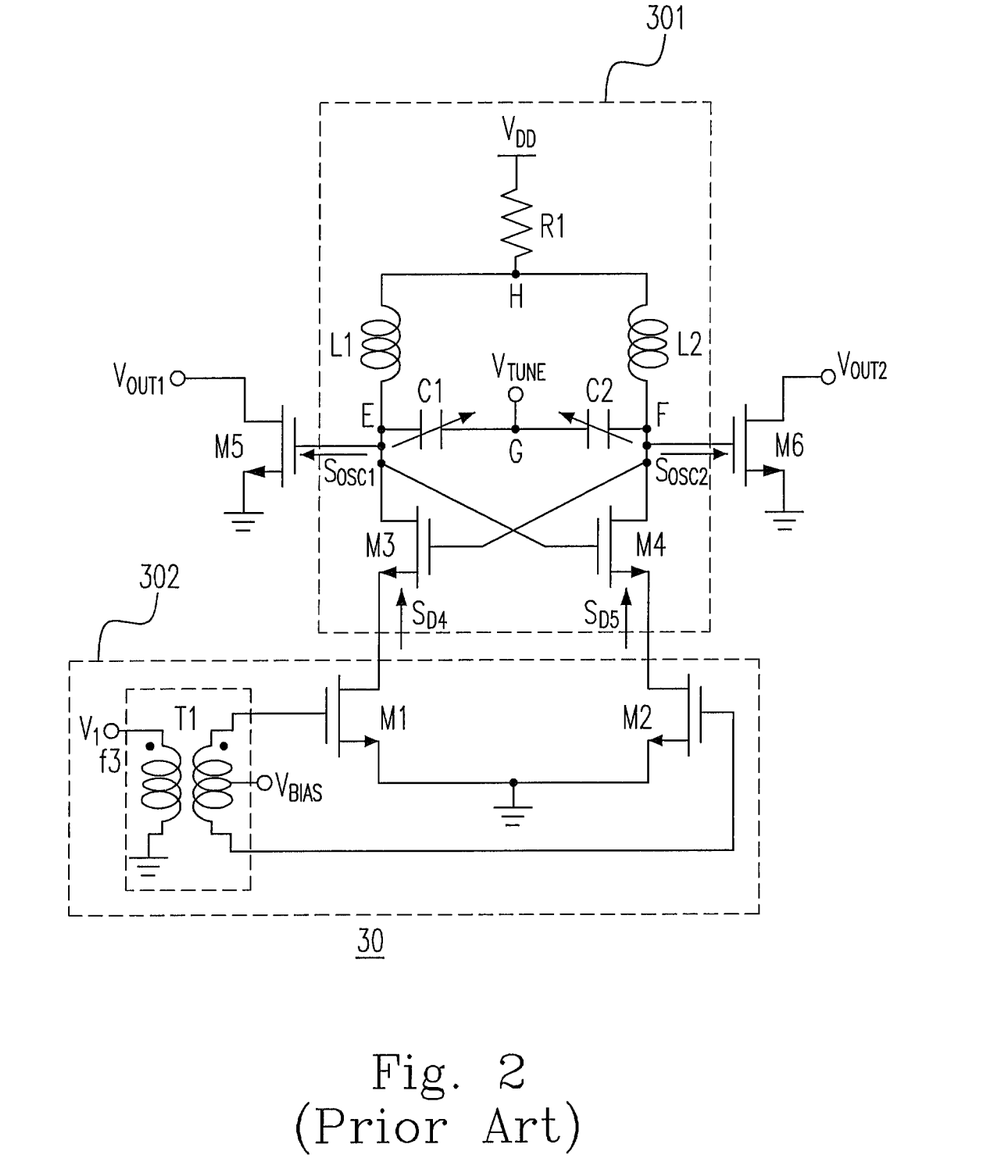
FIG. 2 is a schematic diagram showing another injection-locked frequency multiplier according to the prior art.

Please refer to FIG. 2, which illustrates another injection-locked frequency multiplier by 3 times 30 according to the prior art. The injection-locked frequency multiplier 30 includes a varactor tuned and voltage controlled oscillator 301 and a harmonic generator 302. The oscillator 301 includes inductors L1, L2, capacitors C1, C2, transistors M3, M4 and a resister R1. The harmonic generator 302 includes transistors M1, M2 and a power transformer T1, which is an element disposed outer to the chip and having a primary side and a secondary side.

Referring to FIG. 2, a voltage V1 with a basic frequency f3 is applied to the primary side of the power transformer T1. When adjusting a gate bias $V_{BIAS}$ of the transistor M1, M2, the harmonic generator 302 can generate harmonic signals $S_{H1}$, $S_{H2}$ with largest gain and a frequency $3f_3$ being triple of the basic frequency f3. A tuning voltage $V_{TUNE}$ is applied to the location G to adjust the capacitances of the capacitors C1, C2, so as to increase the injection-locked range of the resonance frequency. The resistor R1 is for improving the harmonic rejection ratios. Eventually, resonance frequency signals $S_{OSC1}$, $S_{OSC2}$ are outputted at the drains of the transistors M3, M4, and the frequencies $f_{OSC1}$, $f_{OSC2}$ of the outputted signals are equal to the triple frequency $3f_3$.

According to the above-mentioned, it is necessary to adjust the basic frequency f3 and manually adjust the voltage VTUNE when one would like to obtain required resonance frequencies $f_{OSC1}$, $f_{OSC2}$, which is inconvenient. Besides, it is not easy to adjust the frequencies $f_{OSC1}$, $f_{OSC2}$ using the capacitors C1, C2, since the parasitic capacitance of the transistors M3, M4 are usually larger than the capacitance of the capacitors C1, C2. According, the injection-locked range of the resonance frequencies $f_{OSC1}$, $f_{OSC2}$ is limited. Therefore, there is a need to develop an adjustable frequency multiplier apparatus and the operating methods thereof.

SUMMARY OF THE INVENTION

To achieve the abovementioned advantages, the present invention provides a frequency multiplier apparatus. The frequency multiplier apparatus includes an injection-locked frequency multiplier and a frequency-to-control signal converter. The injection-locked frequency multiplier outputs an output signal having a first frequency in response to an input signal having a first basic frequency. The frequency-to-control signal converter provides a first control signal to the injection-locked frequency multiplier in response to the input signal. The injection-locked frequency multiplier adjusts the first frequency to a second frequency in response to a change of the first control signal when the first basic frequency is changed to a second basic frequency.

In accordance with another aspect of the present invention, a method for operating a frequency multiplier apparatus is provided. The method includes steps of: (a) outputting an output signal having a first frequency in response to an input signal having a first basic frequency; (b) outputting a control signal in response to the input signal; and (c) adjusting the first frequency to a second frequency in response to a change of the control signal, when the first basic frequency is changed to a second basic frequency.

In accordance with a further aspect of the present invention, a method for operating a frequency multiplier apparatus is provided. The method includes steps of: (a) generating a predetermined operating frequency; (b) generating a control signal in response to the predetermined operating frequency; and (c) outputting a required frequency in response to the control signal.

The frequency multiplier apparatus and operating method thereof can obtain and lock resonance frequencies at a larger bandwidth scope by automatically adjusting the frequency multiplier apparatus, and therefore the convenience as well as flexibility for use is improved.

The above objects and advantages of the present invention will be more readily apparent to those ordinarily skilled in the art after reading the details set forth in the descriptions and drawings that follow, in which:

BRIEF DESCRIPTION OF THE DRAWINGS

FIG. 3 (c) is a schematic diagram showing a frequency-to-control signal converter in accordance with one embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 3A:
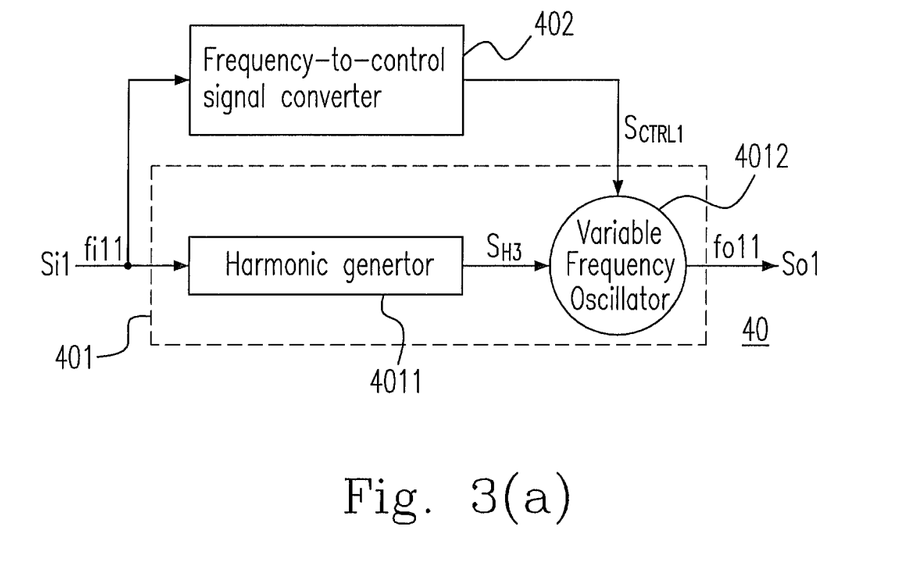
FIGS. 3(a) and 3(b) are schematic diagrams showing a frequency multiplier apparatus in accordance with one embodiment of the present invention, wherein 4011 denotes a harmonic generator.
Figure 3B:
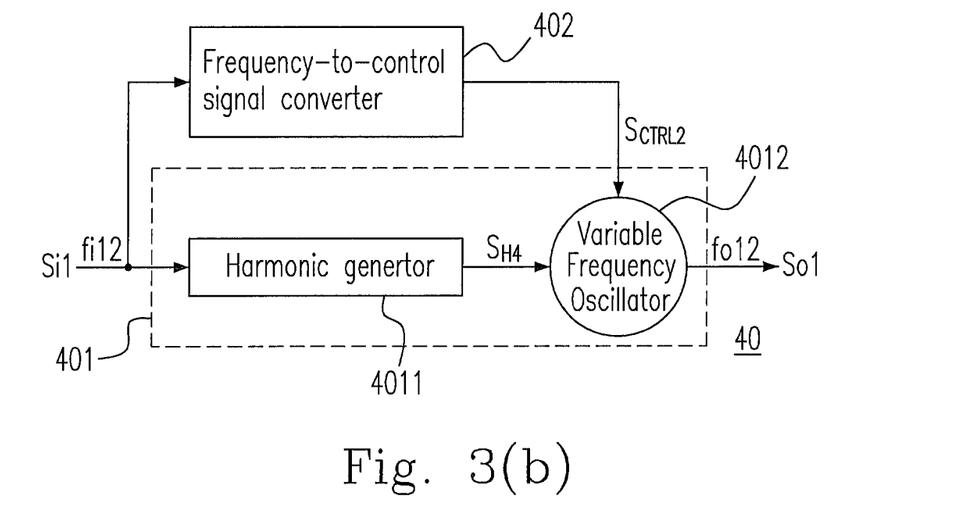

Please refer to FIGS. 3(a) and 3(b), which illustrate a frequency multiplier apparatus 40 in accordance with one embodiment of the present invention. The frequency multiplier apparatus 40 includes an injection-locked frequency multiplier 401 and a frequency-to-control signal converter 402. The injection-locked frequency multiplier 401 outputs an output signal So1 with a first frequency fo11 in response to an input signal Si1 with a first basic frequency fi11. The frequency-to-control signal converter 402 provides a first control signal $S_{CTRL1}$ to the injection-locked frequency multiplier 401 in response to the input signal Si1. According to FIGS. 3(a) and 3(b), the injection-locked frequency multiplier 401 adjusts the first frequency fo11 to a second frequency fo12 in response to a change of the first control signal $S_{CTRL1}$ when the first basic frequency fi11 of the output signal So1 is changed to a second basic frequency fi12, and the $S_{CTRL1}$ is changed to a second control signal $S_{CTRL2}$. Notably, the first control signal $S_{CTRL1}$ includes a first control voltage $V_{CTRL1}$ or a first control current or a first control digital code, and the second control signal $S_{CTRL1}$ includes a second control voltage $V_{CTRL2}$ or a second control current or second control digital code.

In the illustration of FIG. 3(a), the injection-locked frequency multiplier 401 includes a harmonic generator 4011 and a variable-frequency oscillator 4012. In response to the input signal Si1, the harmonic generator 4011 generates a harmonic signal $S_{H3}$ with a frequency value M*fi11, which is M-times of the first basic frequency fi11. In response to the first control signal $S_{CTRL1}$ and the harmonic signal $S_{H3}$, the variable-frequency oscillator 4012 generates the output signal So1 with the first frequency fo11, which is the M-times of the first basic frequency fi11.

Referring to the illustration of FIG. 3(b), when the frequency of the input signal Si1 changes from the first basic frequency fi11 to the second basic frequency fi12, the harmonic generator 4011 generates a harmonic signal $S_{H4}$, with a frequency value 3fi12, which is triple of the second basic frequency fi12. In response to the second control signal $S_{CTRL2}$ and the harmonic signal $S_{H4}$, the variable-frequency oscillator 4012 generates the output signal So1 with the second frequency fo12, which is triple of the second basic frequency fi12.

According to the embodiment set forth above, the frequency of the output signal is M-times of that of the inputted signal. It is appreciated that the frequency value of the output signal can be other multiple of that of the inputted signal when applicable.

In FIGS. 3(a) and 3(b), the variable-frequency oscillator 4012 may be a voltage-controlled oscillator, a current-controlled oscillator or a digital-controlled oscillator, the frequency-to-control signal converter 402 may be a frequency-to-voltage signal converter, a frequency-to-current signal converter or a frequency-to-digital signal converter, and the first control signal $S_{CTRL1}$ may be a voltage signal, a current signal or a digital signal. The type of the variable-frequency oscillator 4012 shall match that of the frequency-to-control signal converter 402. For example, if the variable-frequency oscillator 4012 is a voltage-controlled oscillator and the first control signal $S_{CTRL1}$ a voltage signal, the frequency-to-control signal converter 402 is a frequency-to-voltage signal converter. Likewise, if the variable-frequency oscillator 4012 is a current-controlled oscillator and the first control signal $S_{CTRL1}$ a current signal, the frequency-to-control signal converter 402 is a frequency-to-current signal converter.

Figure 3C:
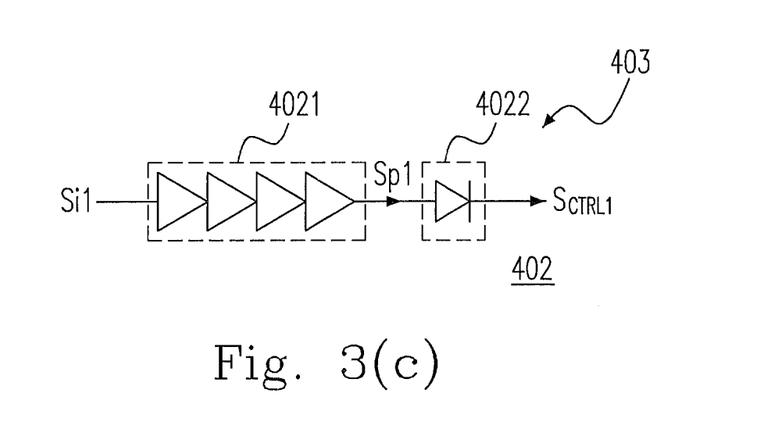

Please refer to FIG. 3(c), which is a schematic diagram of an embodiment of the frequency-to-control signal converter 402 according to the present invention. When the frequency-to-control signal converter 402 is a frequency-to-voltage signal converter 403, the frequency-to-voltage signal converter 403 includes a limiting amplifier 4021 and a power detector 4022. The limiting amplifier 4021 amplifies the input signal Si1 to generate a power signal $S_{P1}$. The power detector 4022 detects the power signal $S_{P1}$, and transforms the power signal SP1 into the first control signal $S_{CTRL1}$.

The frequency-to-control signal converter 402 can automatically adjust the first control signal $S_{TRL1}$ as appropriate in response to a change of the basic frequency of the input signal Si1, so as to cause the frequency-to-control signal converter 402 adjust the output signal So1 to a predetermined frequency. Such an efficacy of the present invention is advantageous over the technical schemes of the prior art.

Figure 4A:
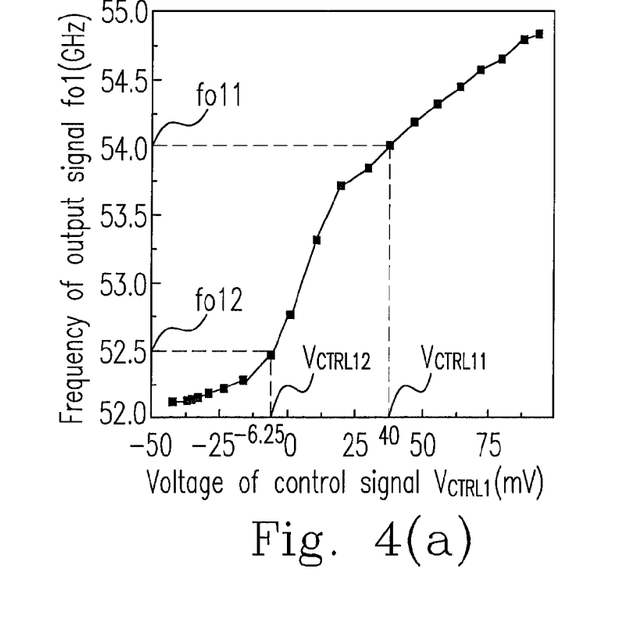
FIG. 4(a) is a schematic diagram showing the relation between the frequency of output signal and the voltage of the control signal in accordance with one embodiment of the present invention.

Please refer to FIG. 4(a), which illustrates the relation between the frequency fo1 of output signal and the voltage $V_{CTRL1}$ of the control signal according to a preferred embodiment of the present invention. It is appreciated that the frequency-to-control signal converter 402 is the frequency-tovoltage signal converter 403 and the variable-frequency oscillator 4012 a voltage-controlled oscillator in this embodiment. The frequency multiplier apparatus 40 cannot automatically adjust the first control signal $S_{CTRL1}$ to a required frequency when the frequency-to-control signal converter 402 has not been calibrated in response to the frequency change of the input signal Si1. Before calibrating the frequency-to-control signal converter 402, there is a need to apply a sequence of the first control voltage $V_{CTRL1}$, where $V_{CTRL1}=\{V_{CTRL11}, V_{CTRL12}, \ldots, V_{CTRL1n}\}$, to the voltage-controlled oscillator. At this moment, the harmonic signals SH3, SH4 have not been injected into the voltage-controlled oscillator. Thus, the voltage-controlled oscillator can generates a signal So1 with a free vibration frequency in response to the first control voltage $V_{CTRL1}$, and the free vibration frequency may change following a change of the first control voltage $V_{CTRL1}$. Typically, there is a linear relationship between the frequency fo1 of output signal and the voltage $V_{CTRL1}$ of the control signal, and the frequency fo1 of output signal is not locked yet.

Figure 4B:
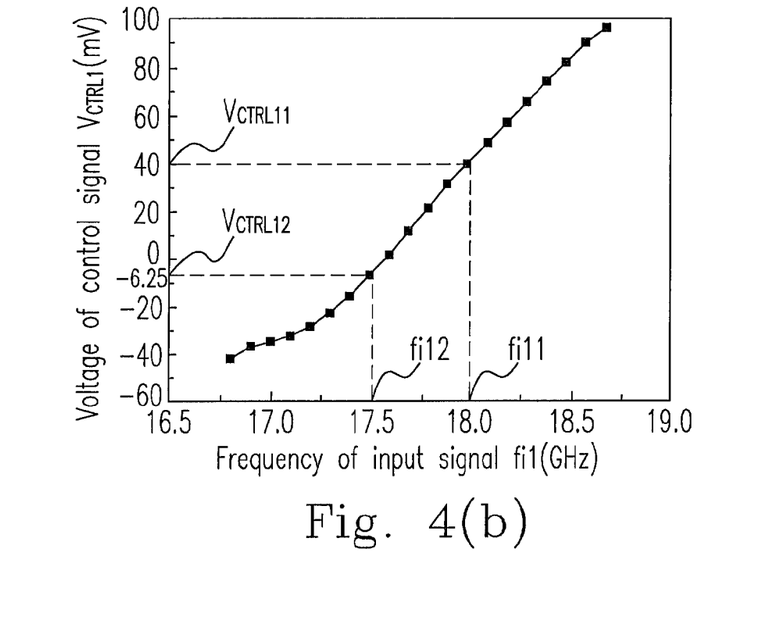
FIG. 4(b) is a schematic diagram showing the relation between the frequency of input signal and the voltage of the control signal in accordance with one embodiment of the present invention.

Please refer to FIG. 4(b), which illustrates the relation between the frequency fi1 of input signal and the voltage $V_{CTRL1}$ of the control signal according to a preferred embodiment of the present invention. After determining the relation between the frequency fo1 of the output signal So1 and the first control voltage $V_{CTRL1}$, the frequency-to-voltage signal converter 403 is then calibrated. The input signal Si1 received by the frequency-to-voltage signal converter 403 has a sequential frequency fi1, where fi1={fi11, fi12, . . . , fi1n}. Having received the input signal Si1, the frequency-to-voltage signal converter 403 outputs a first control signal $S_{CTRL1}$ with a sequence of first control voltage $V_{CTRL1}$, where $V_{CTRL1}=\{V_{CTRL11}, V_{CTRL12}, \ldots, V_{CTRL1n}\}$, in response to the input signal Si1.

Again, referring to FIGS. 4(a) and 4(b), which illustrates an example in accordance with the embodiment that the frequency fo1 of the output signal So1 is triple of the frequency fi1 of the input signal Si1. In other words, fo1=3*fi1. If the required value of the frequency fo1 is 54 GHz, the value of the frequency fi1 is 18 GHz. In FIG. 4(a), the first control voltage $V_{CTRL1}$ at $V_{CTRL11}$, which is 40 millivolt, corresponds to the frequency fo11, which is 54 GHz, of the output signal So1. Therefore, the frequency-to-voltage signal converter 403 is calibrated and outputs the first control signal $S_{CTRL1}$ with the first control voltage $V_{CTRL1}$ at $V_{CTRL11}$, which is 40 millivolt, when the frequency-to-voltage signal converter 403 receives the input signal Si1 with the frequency fi1, which is 18 GHz. Likewise, if the required value of the frequency fo1 is 52.5 GHz, the value of the frequency fi1 is 17.5 GHz. In FIG. 4(a), the first control voltage $V_{CTRL1}$ at $V_{CTRL12}$, which is −6.25 millivolt, corresponds to the frequency fo12, which is 54 GHz, of the output signal So1. Therefore, the frequency-to-voltage signal converter 403 is calibrated and outputs the first control signal $S_{CTRL1}$ with the first control voltage $V_{CTRL1}$ at $V_{CTRL12}$, which is −6.25 millivolt, when the frequency-to-voltage signal converter 403 receives the input signal Si1 with the frequency fi1, which is 17.5 GHz.

Accordingly, the method set forth in the proceeding paragraph can be adopted to obtain the illustrations of FIGS. 4(a) and 4(b). Having completing the calibration for the frequency-to-voltage signal converter 403, the frequency multiplier apparatus 40 can automatically adjust the frequency fo1 of the output signal So1 in response to the change of the frequency fi1 of the input signal Si1, and the output signal So1 is locked, since the input signal Si1 is injected into the injection-locked frequency multiplier 401 while the harmonic signals $S_{H3}$, $S_{H4}$ are injected into the voltage-controlled oscillator.

Figure 5A:
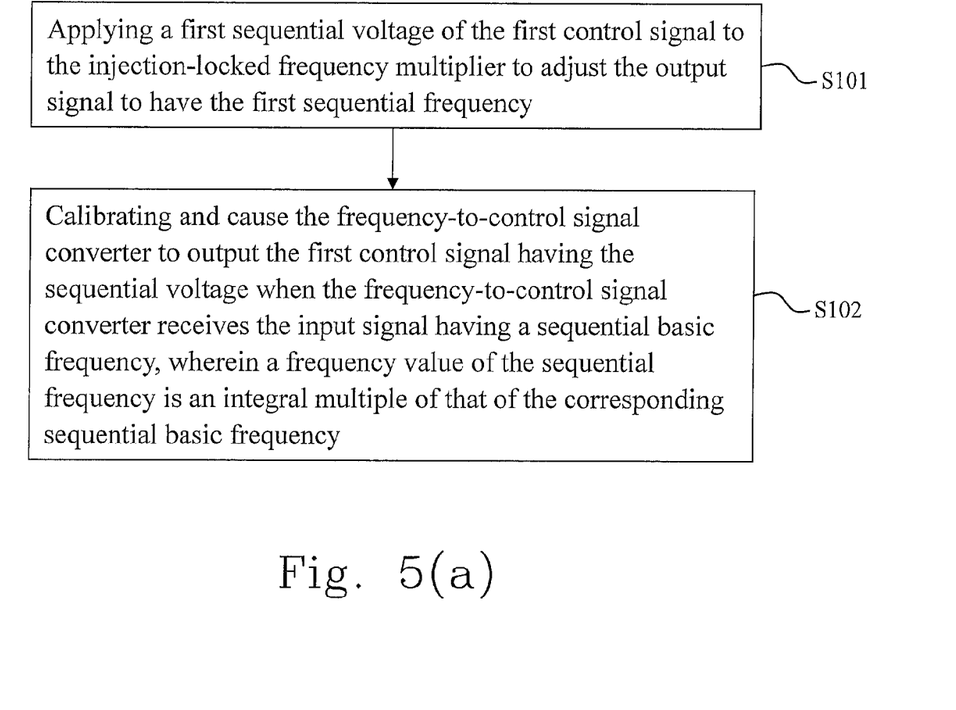
FIGS. 5(a) and 5(b) are flow diagrams showing the operation method of the frequency multiplier apparatus in accordance with one embodiment of the present invention.

Please refer to FIG. 5(a), which illustrates the operation method of the frequency multiplier apparatus 40 according to the abovementioned embodiment of the present invention, and in particular the method for calibrating the frequency-to-control signal converter 402. The operation method includes the following steps: Step S101, applying a sequence of first control voltage $V_{CTRL1}$, where $V_{CTRL1}=\{V_{CTRL11}, V_{CTRL12}, \ldots, V_{CTRL1n}\}$, of the first control signal $S_{CTRL1}$ to the injection-locked frequency multiplier 401 to adjust the output signal So1 to have the first sequential frequency fo1={fo11, fo12, . . . , fo1n}; and Step S102, calibrating and cause the frequency-to-control signal converter 402 to output the first control signal $S_{CTRL1}$ having the sequential voltage $V_{CTRL1}=\{V_{CTRL11}, V_{CTRL12}, \ldots, V_{CTRL1n}\}$ when the frequency-to-control signal converter receives the input signal Si1 having a sequential basic frequency fi1={fi11, fi12, . . . , fi1n}, wherein a frequency value of the sequential frequency fo1 is an integral multiple of that of the corresponding sequential basic frequency fi1.

Figure 5B:
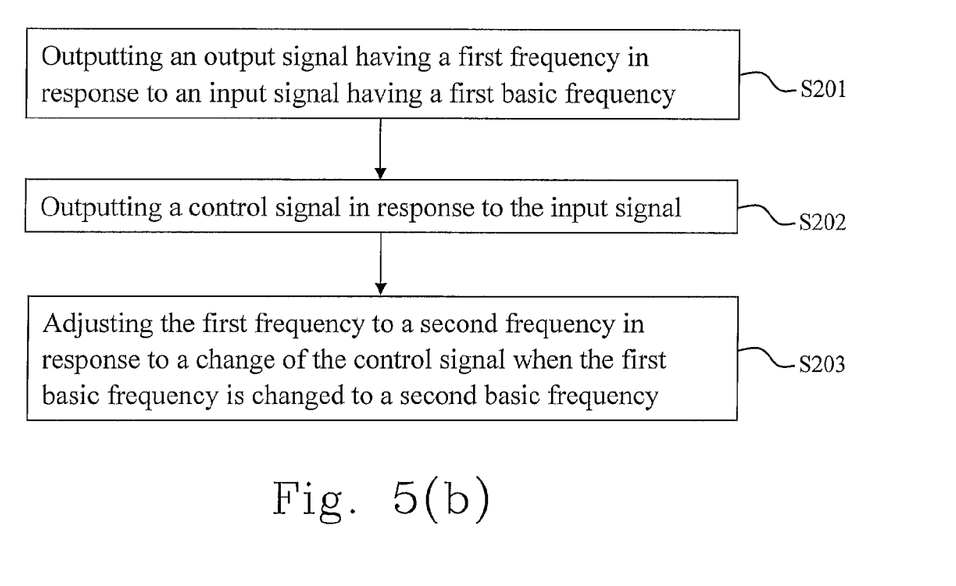

Please refer to FIG. 5(b), which illustrates the operation method of the frequency multiplier apparatus 40 according to the abovementioned embodiment of the present invention, and in particular the auto-adjustment method after calibrating the frequency-to-control signal converter 402. The operation method includes the following steps: Step S201, outputting an output signal So1 having a first frequency fo11 in response to an input signal Si1 having a first basic frequency fi11; Step 202, outputting a control signal $S_{CTRL1}$ in response to the input signal Si1; and Step 203, adjusting the first frequency fo11 to a second frequency fo12 in response to a change of the control signal $S_{CTRL1}$ when the first basic frequency fi11 is changed to a second basic frequency fi12.

Figure 6:
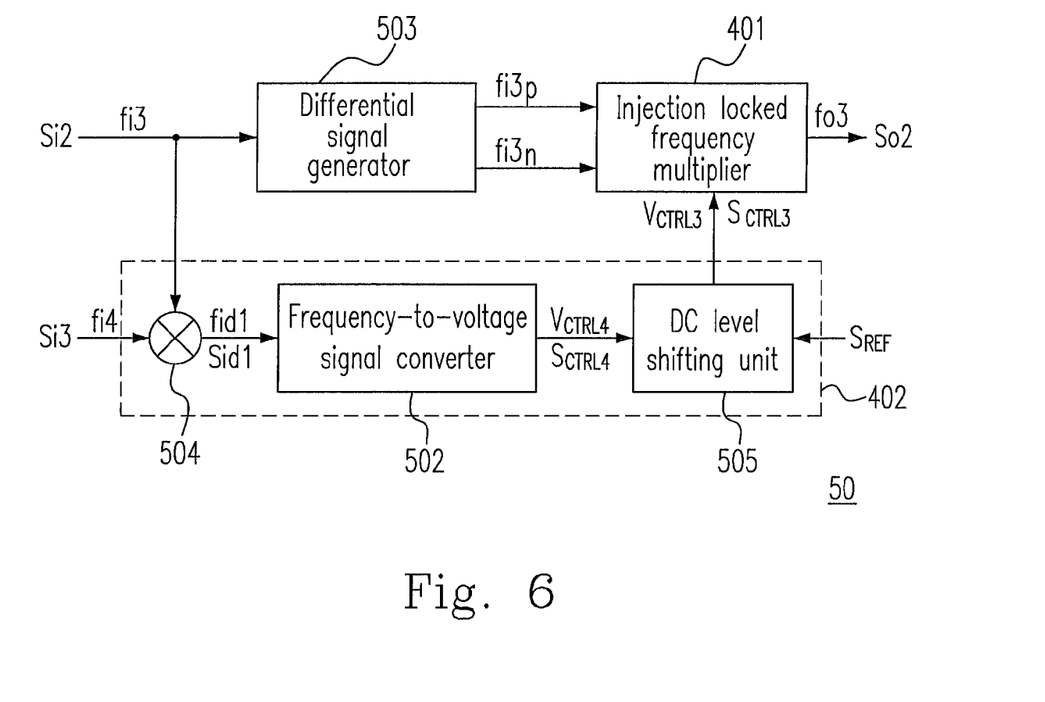
FIG. 6 is a schematic diagram showing a frequency multiplier apparatus in accordance with another embodiment of the present invention.

Please refer to FIG. 6, which illustrates a frequency multiplier apparatus 50 in accordance with another embodiment of the present invention. The frequency multiplier apparatus 50 includes an injection-locked frequency multiplier 401 and a frequency-to-control signal converter 402. The frequency multiplier apparatus 50 further includes a differential signal generator 503, which is employed for generating a phase-complimentary differential signal as the input signal. In FIG. 6, for example, the differential signal 503 receives an input signal Si2 with a third basic frequency fi3={fi31, fi32, . . . , fi3n}, and generates differential signals fi3p, fi3n, wherein the phase difference therebetween is 180 degrees. In one another embodiment of the present invention, the frequency-to-control signal converter 402 includes a frequency-to-voltage signal converter 502, a signal-mixing unit 504 and a DC level shifting unit 505, while the differential signal generator 503 is not used.

The signal-mixing unit 504 is employed to process the input signal Si2 with the third basic frequency fi3 and the signal Si3 with a frequency fi4 to generate a mixed signal Sid1 with a frequency fid1 as the input signal to the frequency-to-voltage signal converter 502. For instance, if the frequencies fi3 and fi4 are 20 GHz and 15 GHz respectively, the signal-mixing unit 504 obtain a frequency fid1=5 GHz by subtracting the frequency value of the frequency fi4 from that of the third basic frequency fi3. Such a method for frequency reduction is an alternative when the frequency of the input signal is too high that the frequency-to-voltage signal converter 502 cannot receive the input signal, and is advantageous for the consequent processing of the frequency-to-voltage signal converter 502. In one embodiment, the frequency-to-voltage signal converter 502 directly receives the input signal Si2 for processing while the signal-mixing unit 504 is not used.

According to one embodiment of the present invention, the frequency-to-voltage signal converter 502 can be the same as the frequency-to-voltage signal converter 403 as illustrated in FIG. 3(c). However, the calibrating method for the embodiment shown in FIG. 6 is different from that for the embodiment in FIGS. 3(a) and 3(b). Particularly, the DC level shifting unit 505 may be employed for compensating the voltage difference between the DC voltage $V_{CTRL3}$ of the first control signal $S_{CTRL3}$ and the DC voltage $V_{CTRL4}$ of the output signal $S_{CTRL4}$ from the frequency-to-voltage signal converter 502.

Figure 7A:
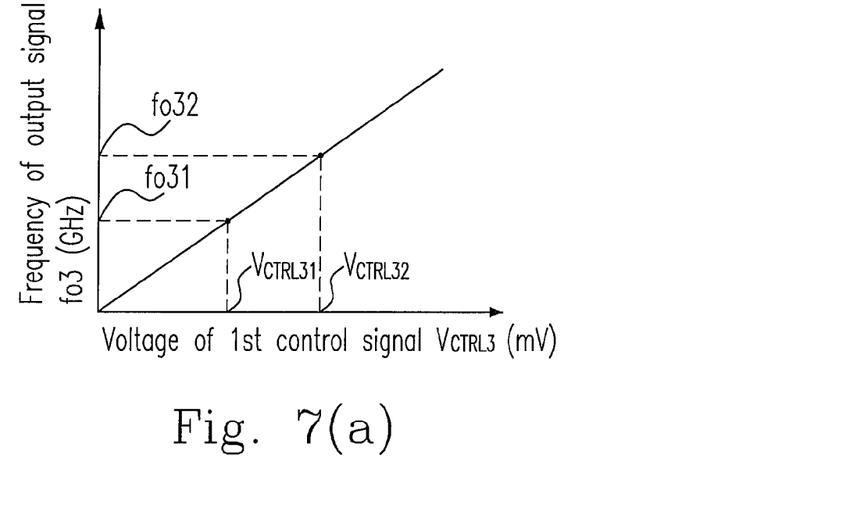
FIG. 7(a) is a schematic diagram showing the relation between the frequency of the output signal and the voltage of the first control signal according to the abovementioned embodiment of the present invention.

Please refer to FIG. 7(a), which illustrates the frequency fo3 of the output signal versus the voltage $V_{CTRL3}$ of the first control signal according to the abovementioned embodiment of the present invention, taking the voltage-controlled oscillator as the variable frequency oscillator 4012 of the Injection locked frequency multiplier 401 for example. Before calibrating the frequency-to-control signal converter 502, there is a need to apply a sequence of the first control voltage $V_{CTRL3}$, where $V_{CTRL3}=\{V_{CTRL31}, V_{CTRL32}, \ldots, V_{CTRL3n}\}$, to the voltage-controlled oscillator. At this moment, the input signal Si2 has not been injected into the voltage-controlled oscillator. Thus, the voltage-controlled oscillator can generates a signal So2 with a free vibration frequency in response to the first control voltage $V_{CTRL3}$, and the free vibration frequency may change following a change of the first control voltage $V_{CTRL3}$. Typically, there is a linear relationship between the frequency fo3 of output signal and the voltage $V_{CTRL3}$ of the control signal, and the frequency fo3 of output signal So2 is not locked yet.

Figure 7B:
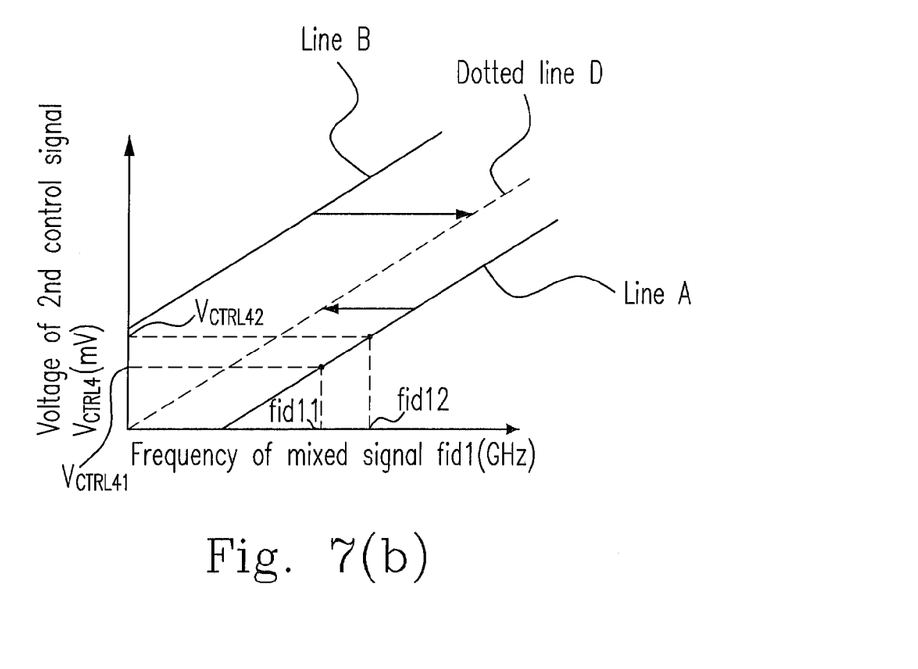
FIG. 7(b) is a schematic diagram showing the relation between the frequency of the mixed signal and the voltage of the second control signal in accordance with one embodiment of the present invention.

Please refer to FIG. 7(b), which illustrates the relation between the frequency fid1 of mixed signal and the voltage $V_{CTRL4}$ of the second control signal according to another preferred embodiment of the present invention. After determining the relation between the frequency fo3 of the output signal So2 and the first control voltage $V_{CTRL3}$, the frequency-to-voltage signal converter 502 is then calibrated. The mixed signal Sid1 received by the frequency-to-voltage signal converter 502 has a sequential frequency fid1, where fid1={fid11, fid12, ..., fid1n}. Having received the mixed signal Sid1, the frequency-to-voltage signal converter 502 outputs a second control signal $S_{CTRL4}$ with a sequence of second control voltage $V_{CTRL4}$, where $V_{CTRL4}=\{V_{CTRL41}, V_{CTRL42}, \ldots, V_{CTRL4n}\}$, in response to the mixed signal Sid1. In one embodiment, the frequency fo3, where fo3={fo31, fo32, ..., fo3n}, of the output signal So2 is triple of the frequency fi3, where fi3={fi31, fi32, ..., fi3n}, of the input signal Si2 for example. In other words, fo3=3*fi3.

According to FIG. 7(b), in one embodiment, the relation between the second control voltage $V_{CTRL4}$ and the sequential frequency fid1 can be illustrated as either the line A or the line B, which are linear without passing the origin. Thus, one may adjust a signal $S_{REF}$ of the DC level shifting unit 505 to cause the voltage value of the first control voltage $V_{CTRL3}$ equals to that of the second control voltage $V_{CTRL4}$, i.e., to move line A or line B toward the dotted line which passes through the origin. The signal $S_{REF}$ can be a reference voltage or a reference current, and alternatives for the frequency-to-voltage signal converter 502 may be a frequency-to-current signal converter or a frequency-to-digital signal converter, according to the requirements.

Having completing the calibration for the frequency-to-voltage signal converter 502, the frequency multiplier apparatus 50 can automatically adjust the frequency fo3 of the output signal So2 in response to the change of the frequency fi3 of the input signal Si2, and the frequency fo3 the output signal So3 is locked, since the input signal Si2 is injected into the injection-locked frequency multiplier 401. The frequency-to-control signal converter 402 causes a change of the first control signal VCTRL3 in response to the signal Si2 with the frequency fi3, so as to automatically adjust the frequency fo3 of the output signal So2.

Figure 8A:
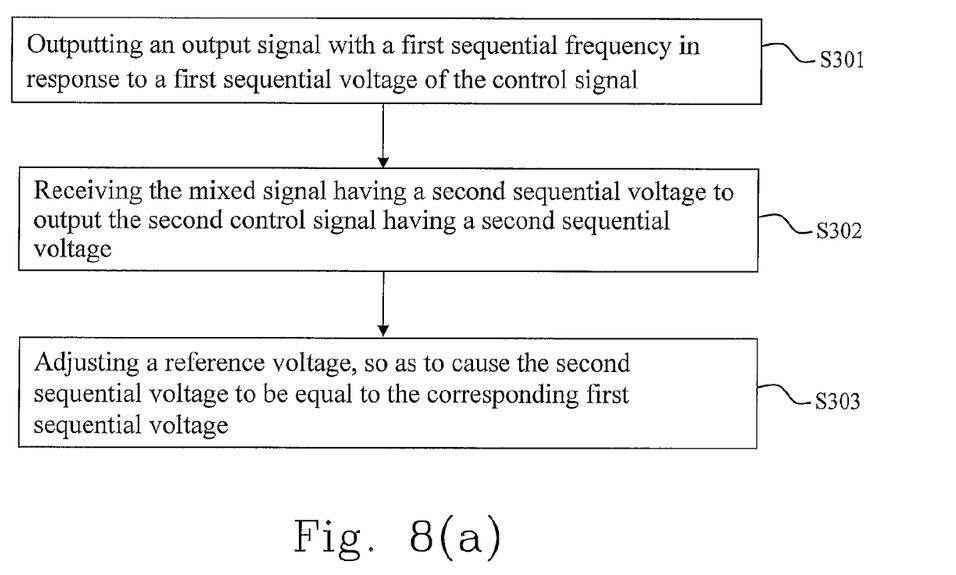
FIGS. 8(a) and 8(b) are flow diagrams showing the operation method of the frequency multiplier apparatus in accordance with another embodiment of the present invention.

Please refer to FIG. 8(a), which illustrates the operation method of the frequency multiplier apparatus 50 according to the abovementioned embodiment of the present invention, and in particular the method for calibrating the frequency-to-control signal converter 502. The operation method includes the following steps: Step S301, outputting an output signal So2 with a first sequential frequency fo3, where fo3={fo31, fo32, ..., fo3n}, in response to a first sequential voltage $V_{CTRL3}$, where $V_{CTRL3}=\{V_{CTRL31}, V_{CTRL32}, \ldots, V_{CTRL3n}\}$, of the first control signal $S_{CTRL3}$; Step S302, the frequency-to-control signal converter 502 receiving the mixed signal Sid1 having a second sequential voltage fid1, where fid1={fid11, fid12, ..., fid1n}, and outputting a second control signal $S_{CTRL4}$ with a second sequential voltage $V_{CTRL4}$, where $V_{CTRL4}=\{V_{CTRL41}, V_{CTRL42}, \ldots, V_{CTRL4n}\}$, in response to the mixed signal Sid1; and Step 303, adjusting a reference voltage, so as to cause the second sequential voltage $V_{CTRL4}$ to be equal to the corresponding first sequential voltage $V_{CTRL3}$.

Figure 8B:
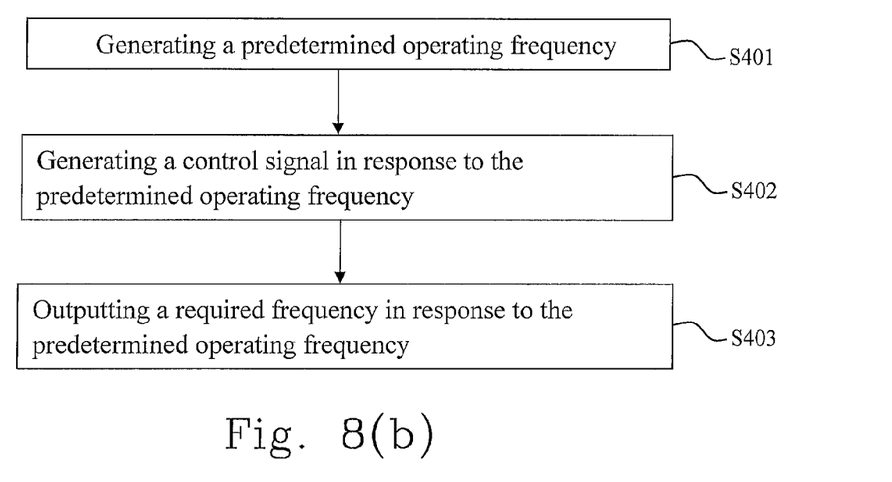

Please refer to FIG. 8(b), which illustrates the operation method of the frequency multiplier apparatus 50 according to the abovementioned embodiment of the present invention, and in particular the auto-adjustment and outputting the frequency fo3 after calibrating the frequency-to-control signal converter 502. The method shown in FIG. 8(b) may also be applicable to the frequency multiplier apparatus 40. Please also refer to FIGS. 3(a) and 6, the operation method for the frequency multiplier apparatus 40 or 50 includes the following steps: Step S401, generating a predetermined operating frequency fid1, fi1; Step S402, generating a control signal $S_{CTRL3}$, $S_{CTRL4}$ in response to the predetermined operating frequency fid1, fi1; and Step S403, outputting a required frequency fo3, fo1 in response to the predetermined operating frequency fid1, fi1.

Figure 9A:
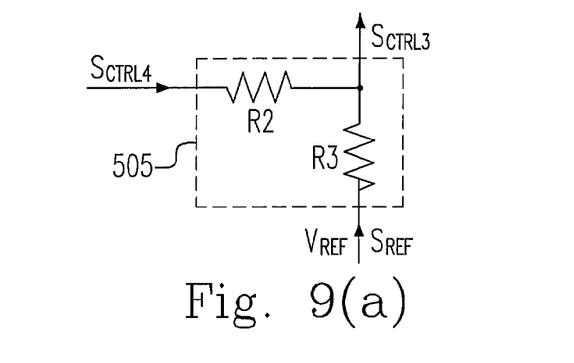
FIG. 9(a) is a schematic diagram showing the DC level shifting unit according to one embodiment of the present invention.

Please refer to FIG. 9(a), in one embodiment, the DC level shifting unit 505 includes resistors R2, R3. The second control voltage $V_{CTR4}$ of the second control signal $S_{CTRL4}$ is applied to the resistor R2 while the reference voltage $V_{REF}$ of the reference signal $S_{REF}$ is applied to the resistor R3, so as to adjust the second control voltage $V_{CTR4}$ to be equal to the first control voltage $V_{CTR3}$.

Figure 9B:
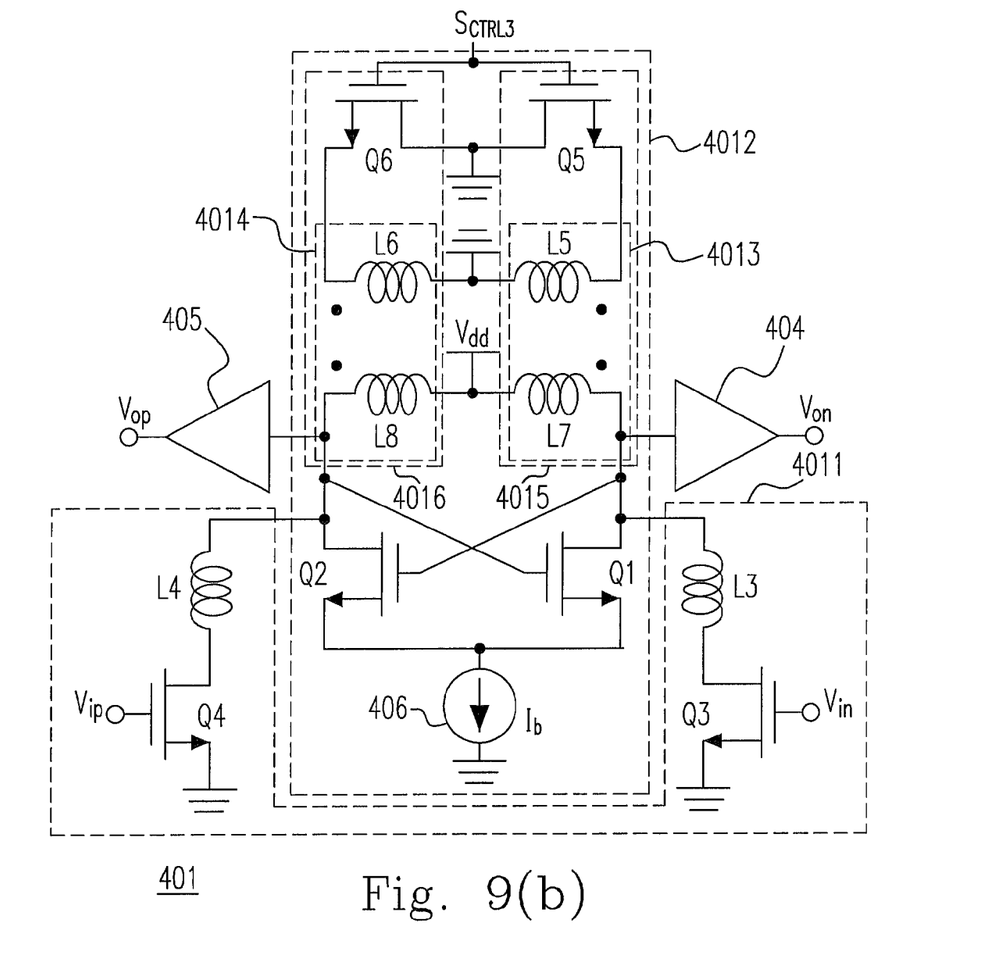
FIG. 9(b) is a schematic diagram showing the injection locked frequency multiplier according to one embodiment of the present invention.

FIG. 9(b) shows one embodiment of the injection locked frequency multiplier 401 according to the present invention. The harmonic generator 4011 includes a pair of transistors Q3, Q4, coupled to the drains of transistors Q1, Q2 via inductors L3, L4, respectively. Voltages Vin, Vip are applied to the gates of the transistors Q3, Q4 respectively, so as to produce a bias at a non-linear area and generate third harmonics which is injected into the variable frequency oscillator 4012. The variable frequency oscillator 4012 includes a pair of transistors Q5, Q6, a pair of voltage transformers 4013, 4014 and a pair of transistors Q1, Q2. The injection locked frequency multiplier 401 further includes a pair of buffers 404, 405 respectively outputting output voltages Von, Vop at each of the output terminals thereof. A current source 406 is coupled to the sources of the transistors Q1, Q2 to provide a bias current Ib. The gates of the transistors Q1, Q2 are coupled to the input terminals of the buffers 404, 405 respectively. Inductors L7, L8 are coupled to the buffers 404, 405 respectively. A voltage Vdd is applied to the location where the inductors L7, L8 are connected to each other. The transistors Q5, Q6 are respectively coupled to two inductors L7, L8 in parallel.

Gates of the transistors Q5, Q6 are coupled to each other, and controlled by the first control voltage $V_{CTRL3}$ of the first control signal $S_{CTRL3}$. Thus, each of the transistors Q5, Q6 can be used as a variable resistor whose equivalent resistance can be adjusted by the first control voltage $V_{CTRL3}$. The transistor Q5 is coupled to the voltage transformer 4013, and therefore the combination thereof constitutes a variable inductor 4015 whose inductance can be adjusted by controlling the first control voltage $V_{CTRL3}$, which is different from the prior art that adjusts resonance frequencies using capacitors C1, C2 in FIG. 2. The advantage of adjusting resonance frequencies by using variable inductors 4015, 4016 according to present invention is that a wider range of resonance frequencies is achievable.

Embodiments

1. A frequency multiplier apparatus, comprising:
an injection-locked frequency multiplier outputting an output signal having a first frequency in response to an input signal having a first basic frequency; and
a frequency-to-control signal converter providing a first control signal to the injection-locked frequency multiplier in response to the input signal, wherein the injection-locked frequency multiplier adjusts the first frequency to a second frequency in response to a change of the first control signal when the first basic frequency is changed to a second basic frequency.
2. The frequency multiplier apparatus of embodiment 1, wherein a frequency value of the second frequency is an integral multiple of that of the second basic frequency.
3. The frequency multiplier apparatus of embodiment 1, wherein the injection-locked frequency multiplier includes:
a harmonic generator generating a harmonic signal in response to the input signal; and
a variable-frequency oscillator including one selected from a group consisting of a voltage-controlled oscillator, a current-controlled oscillator and a digital-controlled oscillator, and adjusting the first basic frequency to the second basic frequency in response to a change of the first control signal and a change of the harmonic signal.
4. The frequency multiplier apparatus of embodiment 1, wherein the frequency-to-control signal converter includes one selected from a group consisting of a frequency-to-voltage signal converter, a frequency-to-current signal converter and a frequency-to-digital signal converter.
5. The frequency multiplier apparatus of embodiment 1, wherein the first control signal includes one selected from a group consisting of a voltage signal, a current signal and a digital signal.
6. The frequency multiplier apparatus of embodiment 1, wherein the frequency-to-control signal converter includes:
a signal-mixing unit down-converting the first basic frequency to a third basic frequency, and outputting a mixed signal having the third basic frequency;
a frequency-to-voltage signal converter receiving the mixed signal, outputting a second control signal, and including:
a limiting amplifier amplifying the mixed signal to generate a power signal; and
a power detector detecting the power signal, and transforming the power signal into the second control signal; and
a DC level shifting unit outputting the first control signal in response to the second control signal.

7. The frequency multiplier apparatus of embodiment 6, wherein the frequency-to-voltage signal converter changes a voltage of the second control signal in response to the mixed signal, and the DC level shifting unit adjusts the first control signal in response to the second control signal, when the first basic frequency is changed to the second basic frequency.
8. The frequency multiplier apparatus of embodiment 1, further comprising:
a differential-signal generator generating a phase-complimentary differential signal as the input signal.
9. The frequency multiplier apparatus of embodiment 6, configured to apply a first voltage of the first control signal to the injection-locked frequency multiplier to adjust the output signal to have a first sequential frequency.
10. The frequency multiplier apparatus of embodiment 9, wherein the frequency-to-voltage signal converter receives the mixed signal having a second frequency to adjust the second control signal to have a second voltage.
11. The frequency multiplier apparatus of embodiment 10, wherein:
the first control signal is a sequential first control signals and the first voltage is a sequential first voltages;
the output signal is a sequential output signals and the first frequency is a sequential first frequencies;
the second control signal is a sequential second control signals and the second voltage is a sequential second voltages; and
the mixed signal is sequential mixed signals and the second frequency is a sequential second frequencies.
12. The frequency multiplier apparatus of embodiment 11, configured to adjust a reference voltage applied to the DC level shifting unit, so as to cause the second sequential voltages to be correspondingly equal to the first sequential voltages.
13. The frequency multiplier apparatus of embodiment 1, configured to apply a voltage of the first control signal to the injection-locked frequency multiplier, so as to adjust the output signal to have a frequency.
14. The frequency multiplier apparatus of embodiment 13, configured to calibrate and cause the frequency-to-control signal converter to output the first control signal having the voltage when the frequency-to-control signal converter receives the input signal having a basic frequency, wherein a frequency value of the frequency is an integral multiple of that of the basic frequency.
15. A method for operating a frequency multiplier apparatus, comprising steps of:
outputting an output signal having a first frequency in response to an input signal having a first basic frequency;
outputting a control signal in response to the input signal; and
adjusting the first frequency to a second frequency in response to a change of the control signal, when the first basic frequency is changed to a second basic frequency.
16. The method of embodiment 15, wherein the frequency multiplier apparatus comprises a frequency-to-control signal converter, and the method further comprises a step of:
adjusting the output signal to have a frequency in response to a voltage of the control signal.
17. The method of embodiment 16, further comprising a step of:
calibrating and causing the frequency-to-control signal converter to output the control signal having the voltage when receiving the input signal having a basic frequency.
18. The method of embodiment 17, wherein a frequency value of the frequency is an integral multiple of that of the basic frequency.

19. The method of embodiment 18, wherein:
the output signal is a sequential output signals, and the frequency is a sequential frequencies;
the control signal is a sequential control signals, and the voltage is a sequential voltages;
the input signal is a sequential input signals, and the basic frequency is a sequential basic frequencies; and
a plurality of values of the sequential frequencies are a plurality of integral multiples of the those of the sequential basic frequencies correspondingly.

20. A method for operating a frequency multiplier apparatus, comprising steps of:
generating a predetermined operating frequency;
generating a control signal in response to the predetermined operating frequency; and
outputting a required frequency in response to the control signal.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims that are to be accorded with the broadest interpretation so as to encompass all such modifications and similar structures.

What is claimed is:

1. A frequency multiplier apparatus, comprising:
an injection-locked frequency multiplier receiving an input signal having a first basic frequency, and outputting an output signal having a first frequency in response to the input signal; and
a frequency-to-control signal converter parellelly receiving the input signal, and providing a first control signal to the injection-locked frequency multiplier in response to the input signal, wherein the injection-locked frequency multiplier adjusts the first frequency to a second frequency in response to a change of the first control signal when the first basic frequency is changed to a second basic frequency, the frequency-to-control signal converter includes a limiting amplifier and a power detector, the limiting amplifier amplifies the input signal to generate a power signal, and the power detector detects the power signal and transforms the power signal into the first control signal.

2. A frequency multiplier apparatus as claimed in claim 1, wherein a frequency value of the second frequency is an integral multiple of that of the second basic frequency.

3. A frequency multiplier apparatus as claimed in claim 1, wherein the injection-locked frequency multiplier includes:
a harmonic generator generating a harmonic signal in response to the input signal; and
a variable-frequency oscillator including one selected from a group consisting of a voltage-controlled oscillator, a current-controlled oscillator and a digital-controlled oscillator, and adjusting the first basic frequency to the second basic frequency in response to a change of the first control signal and a change of the harmonic signal.

4. A frequency multiplier apparatus as claimed in claim 1, wherein the frequency-to-control signal converter includes one selected from a group consisting of a frequency-to-voltage signal converter, a frequency-to-current signal converter and a frequency-to-digital signal converter.

5. A frequency multiplier apparatus as claimed in claim 1, wherein the first control signal includes one selected from a group consisting of a voltage signal, a current signal and a digital signal.

6. A frequency multiplier apparatus as claimed in claim 1, configured to apply a voltage of the first control signal to the injection-locked frequency multiplier, so as to adjust the output signal to have a frequency.

7. A frequency multiplier apparatus as claimed in claim 6, configured to calibrate and cause the frequency-to-control signal converter to output the first control signal having the voltage when the frequency-to-control signal converter receives the input signal having a basic frequency, wherein a frequency value of the frequency is an integral multiple of that of the basic frequency.

8. A method for operating a frequency multiplier apparatus having an injection-locked frequency multiplier and a frequency-to-control signal converter including a limiting amplifier and a power detector, comprising steps of:
causing the injection-locked frequency multiplier to receive an input signal having a first basic frequency, and to output an output signal having a first frequency in response to the input signal; and
causing the frequency-to-control signal converter to parellelly receive the input signal, and providing a first control signal to the injection-locked frequency multiplier in response to the input signal, wherein the injection-locked frequency multiplier adjusts the first frequency to a second frequency in response to a change of the first control signal when the first basic frequency is changed to a second basic frequency, the limiting amplifier amplifies the input signal to generate a power signal, and the power detector detects the power signal and transforms the power signal into the first control signal.

* * * * *